United States Patent
Fan et al.

(10) Patent No.: US 10,490,574 B2
(45) Date of Patent: Nov. 26, 2019

(54) LOW-REFLECTION COMPOSITE ELECTRODE AND TFT ARRAY SUBSTRATE

(71) Applicant: HUIZHOU CHINA STAR OPTOELECTRONICS TECHNOLOGY CO., LTD., Huizhou Guangdong (CN)

(72) Inventors: Yong Fan, Huizhou Guangdong (CN); Yuchun Hsiao, Huizhou Guangdong (CN); Chengwen Que, Huizhou Guangdong (CN)

(73) Assignee: HUIZHOU CHINA STAR OPTOELECTRONICS TECHNOLOGY CO., LTD., Huizhou (CN)

( * ) Notice: Subject to any disclaimer, the term of this patent is extended or adjusted under 35 U.S.C. 154(b) by 0 days.

(21) Appl. No.: 15/982,907

(22) Filed: May 17, 2018

(65) Prior Publication Data
US 2019/0206895 A1    Jul. 4, 2019

Related U.S. Application Data

(63) Continuation of application No. PCT/CN2018/073497, filed on Jan. 19, 2018.

(30) Foreign Application Priority Data

Dec. 28, 2017    (CN) .......................... 2017 1 1459657

(51) Int. Cl.
*H01L 29/49*    (2006.01)
*H01L 27/12*    (2006.01)
(Continued)

(52) U.S. Cl.
CPC ........ *H01L 27/124* (2013.01); *H01L 29/4908* (2013.01); *G02F 1/1368* (2013.01);
(Continued)

(58) Field of Classification Search
CPC ............... H01L 27/124; H01L 27/3276; H01L 29/4908; H01L 51/5281; G02F 1/136286; G02F 1/1368; G02F 2001/136295
(Continued)

(56) References Cited

U.S. PATENT DOCUMENTS 9,845,529 B2 * 12/2017 Ochi ........................ C22C 21/00
2016/0340773 A1 * 11/2016 Ochi ........................ C22C 21/00
(Continued)

FOREIGN PATENT DOCUMENTS

| CN | 103700735 A | 4/2014 |
|----|-------------|--------|
| CN | 103733350 A | 4/2014 |

(Continued)

*Primary Examiner* — Long K Tran
(74) *Attorney, Agent, or Firm* — Hemisphere Law, PLLC; Zhigang Ma

(57) ABSTRACT

The present disclosure provides a low-reflection composite electrode including a first metal layer, a first transparent material layer and a second metal layer and a TFT array substrate using the same. The first metal layer, the first transparent material layer and the second metal layer are sequentially stacked. The low-reflection composite electrode has an extremely low reflection rate. In addition, the average reflection rate of the low-reflection composite electrode is lower than 3%, and even lower than 1% within the green light band. If the TFT array substrate is used in AM-OLED and AM-LCD, the gate and/or the source/drain of the TFT array substrate are the low-reflection composite electrodes, so the polarizer in the AM-LED and the low-reflection coating in the AM-LCD become unnecessary. Thus, the production cost can be reduced and the products can have its superiority.

19 Claims, 3 Drawing Sheets

(51) Int. Cl.
    *H01L 27/32* (2006.01)
    *G02F 1/1362* (2006.01)
    *G02F 1/1368* (2006.01)
    *H01L 51/52* (2006.01)

(52) U.S. Cl.
    CPC .............. *G02F 1/136286* (2013.01); *G02F 2001/136295* (2013.01); *H01L 27/3276* (2013.01); *H01L 51/5281* (2013.01)

(58) Field of Classification Search
    USPC ........................................................ 257/72
    See application file for complete search history.

(56) References Cited

U.S. PATENT DOCUMENTS

2017/0090230 A1* 3/2017 Yoon .................. G02F 1/13336
2017/0219741 A1* 8/2017 Frey .................... H05K 9/0096

FOREIGN PATENT DOCUMENTS

| CN | 105683884 A | 6/2016 |
| CN | 105932172 A | 9/2016 |

\* cited by examiner

LOW-REFLECTION COMPOSITE ELECTRODE AND TFT ARRAY SUBSTRATE

RELATED APPLICATIONS

The present application is a continuation application of International Application Number PCT/CN2018/073497, filed Jan. 19, 2018, and claims the priority of China Application 201711459657.4, filed Dec. 28, 2017.

FIELD OF THE DISCLOSURE

The disclosure relates to the display technology field, and more particularly to a low-reflection composite electrode and a TFT array substrate using the same.

BACKGROUND

In an AM-OLED display device or an AM-LCD display device, the metal electrodes including the gate, the source and the drain are usually made of signal metal such as Cu, Al, Ag, Au, Mo or Cr or a composite metal such as Mo/Cu, Mo/Al or Mo/Al/Mo. In either case, the reflection rates of theses metal electrodes are large. Generally, within the visible light band of which the wave length rage is 400 nm~700 nm, the average reflection rates of theses metal electrodes can be larger than or equal to 40%.

When there is an external light source, the metal electrodes emit more reflection lights which affect the performance of the display device. The larger the incidence angle of the light from the external light source is, the more the reflection lights will be, and thus the performance of the display device is affected more. Considering that, for an AM-OLED display panel, a λ/4 polarizer is attached to the AM-OLED display panel to reduce the reflection lights; however, the production cost is thus increased. In addition, for an AM-LCD display panel, a low-reflection coating and an anti-glare structure are attached to a polarizer to reduce the reflection lights; however, the production cost and/or the manufacturing complexity is thus increased.

Thus, a low-reflection electrode to replace the high-reflection metal electrodes used in the TFT array substrate is needed. If the polarizer in the AM-OLED display panel and the low-reflection coating in the AM-LCD display panel can be removed because of the low-reflection electrode, the production cost of the AM-OLED display panel or the AM-LCD display panel can be decreased and this kind of AM-OLED display panel or AM-LCD display panel can have its superiority.

SUMMARY

The present disclosure provides a low-reflection composite electrode. The average reflection rate of the low-reflection composite electrode is lower than 3%. If the low-reflection composite electrode is used in AM-OLED or in AM-LCD, the polarizer in the AM-LED and the low-reflection coating in the AM-LCD become unnecessary, and thus the production cost can be decreased.

The low-reflection composite electrode provided by the present disclosure includes a first metal layer, a first transparent material layer and a second metal layer, and the first metal layer, the first transparent material layer and the second metal layer are sequentially stacked.

In one embodiment of the low-reflection composite electrode provided by the present disclosure, the first metal layer and/or the second metal layer is a single metal layer or a composite metal layer.

In one embodiment of the low-reflection composite electrode provided by the present disclosure, the first metal layer is made of at least one of Cr, Ti and Mo, the thickness of the first metal layer is 2 nm~15 nm, the second metal layer is made of at least one of Cu, Al and Mo, and the thickness of the second metal layer is 200 nm~500 nm.

In one embodiment of the low-reflection composite electrode provided by the present disclosure, the first transparent material layer is made of a transparent electrode material or a transparent medium material.

In one embodiment of the low-reflection composite electrode provided by the present disclosure, the transparent electrode material is IZO, ITO or IGZO, and the transparent medium material is $SiN_x$, $SiO_x$, $TiO_2$ or $Ta_2O_5$.

In one embodiment of the low-reflection composite electrode provided by the present disclosure, the thickness of the first transparent material layer is 10 nm~150 nm.

In one embodiment of the low-reflection composite electrode provided by the present disclosure, the low-reflection composite electrode further includes a second transparent material layer. The second transparent material layer is stacked on one surface which is of the first metal layer and is opposite to the first transparent material layer.

In one embodiment of the low-reflection composite electrode provided by the present disclosure, the second transparent material layer is made of a transparent electrode material or a transparent medium material.

In one embodiment of the low-reflection composite electrode provided by the present disclosure, the thickness of the second transparent material layer is 10 nm~150 nm.

The present disclosure also provides a TFT array substrate including a low-reflection composite electrode according to any of the above embodiments.

The low-reflection composite electrode provided by the present disclosure has an extremely low reflection rate. In addition, the average reflection rate of the low-reflection composite electrode is lower than 3%, and even lower than 1% within the green light band. Particularly, the TFT array substrate having low-reflection composite electrodes can be perfectly used in AM-OLED and AM-LCD. The gate and/or the source/drain of the TFT array substrate are the low-reflection composite electrodes, so the polarizer in the AM-LED and the low-reflection coating in the AM-LCD become unnecessary. Thus, the production cost can be reduced and the products can have its superiority.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The technical solutions in the embodiments of the disclosure will be described clearly and completely hereinafter with reference to the accompanying drawings in the embodiments of the disclosure so that those skilled in the art may better understand the solutions of the disclosure. Evidently, the described embodiments are merely some embodiments rather than all embodiments of the disclosure. All other embodiments obtained by persons of ordinary skill in the art based on the embodiments of the disclosure without creative efforts shall belong to the protection scope of the disclosure.

It needs to be noted that the terms "first", "second" and so on in the specification, the claims and the accompanying drawings of the disclosure are used for distinguishing similar objects, but are not necessarily used for describing a specific sequence or a precedence order. It should be understood that data used in this way are interchangeable in an appropriate condition, so that the embodiments described herein of the disclosure can be implemented in a sequence besides those illustrated or described herein.

Figure 1:
FIG. 1 is a schematic diagram of a low-reflection composite electrode according to an embodiment of the disclosure.

Referring to FIG. 1, a schematic diagram of a low-reflection composite electrode according to an embodiment of the disclosure is shown. As shown in FIG. 1, the low-reflection composite electrode includes a first metal layer 11, a first transparent material layer 12 and a second metal layer 13, and the first metal layer 11, the first transparent material layer 12 and the second metal layer 13 are sequentially stacked.

Figure 2:
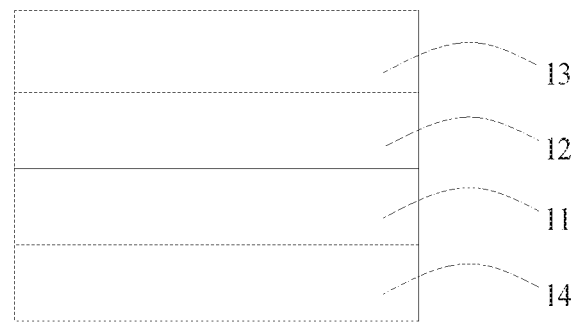
FIG. 2 is a schematic diagram of a low-reflection composite electrode according to another embodiment of the disclosure.

Referring to FIG. 2, a schematic diagram of a low-reflection composite electrode according to another embodiment of the disclosure is shown. As shown in FIG. 2, the low-reflection composite electrode also includes a second transparent material layer 14. The second transparent material layer 14 is stacked on one surface which is of the first metal layer 11 and is opposite to the first transparent material layer 12.

In this embodiment, the first metal layer 11 and/or the second metal layer 13 is a single metal layer or a composite metal layer.

The first metal layer is made of at least one of Cr, Ti and Mo, and the second metal layer is made of at least one of Cu, Al and Mo.

It is worth mentioning that, that the layer is made of at least one of elements, it may be a signal metal layer made of one kind of element or a composite metal layer made of at least two kinds of elements. If the layer is a composite metal layer made of at least two kinds of elements, the composite metal layer can include three metal layers stacked together. In this case, the top layer and the bottom layer can be made by one kind of element, and the middle layer can be made by another kind of element.

In this embodiment, the thickness of the first metal layer 11 is controlled within 2 nm~15 nm, and the thickness of the second metal layer 13 is controlled within 200 nm~500 nm.

The first transparent material layer 12 and the second transparent material layer 14 can be made of a transparent electrode material or a transparent medium material.

The transparent electrode material can be IZO, ITO or IGZO, and the transparent medium material can be $SiN_x$, $SiO_x$, $TiO_2$ or $Ta_2O_5$.

Moreover, the thickness of the first transparent material layer 12 and the thickness of the second transparent material layer 14 are both controlled within 10 nm~150 nm.

The following embodiments are for illustrating but not for restricting the above described low-reflection composite electrode.

Embodiment 1

The low-reflection composite electrode has a structure shown by FIG. 1. As shown in FIG. 1, the first metal layer 11 of the low-reflection composite electrode is made of Mo and has a 4.36 nm thickness, the first transparent material layer 12 of the low-reflection composite electrode is made of ITO and has a 44.5 nm thickness, and the second metal layer 13 of the low-reflection composite electrode is made of Cu and has a 380 nm thickness.

Figure 3:
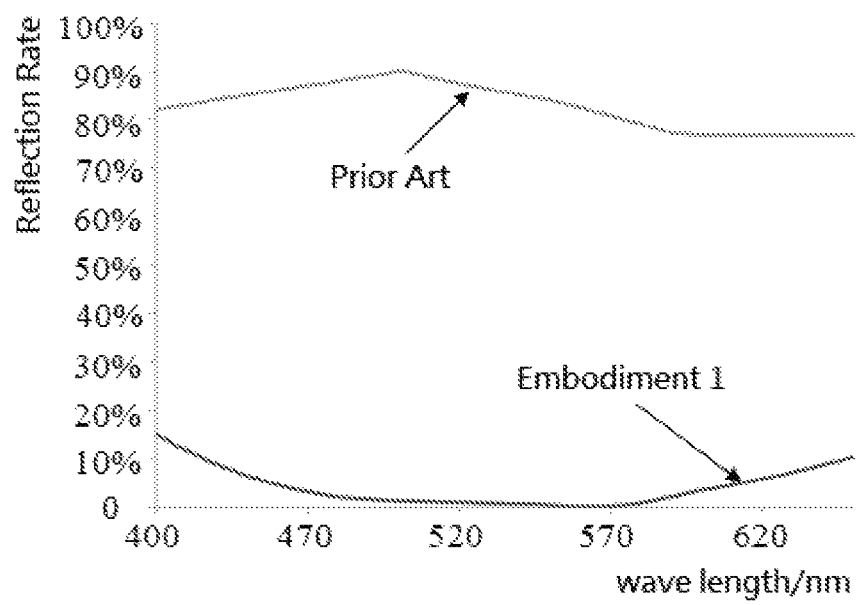
FIG. 3 is a curve diagram showing the reflection rates of a low-reflection composite electrode and a conventional electrode according to the embodiment 1 of the disclosure.

The reflection rate of the low-reflection composite electrode provided by this embodiment is shown in FIG. 3. In FIG. 3, the low reflection rate of the low-reflection composite electrode provided by this embodiment is emphasized by the comparison with the Cu electrode of the prior art.

As shown in FIG. 3, the average reflection rate of a conventional metal electrode is larger than or equal to 80%; however, the average reflection rate of the low-reflection composite electrode provided by this embodiment is less than 3%. Compared with the conventional metal electrode, the low-reflection composite electrode provided by this embodiment has a much smaller reflection rate.

Embodiment 2

The low-reflection composite electrode has a structure shown by FIG. 1. As shown in FIG. 1, the first metal layer 11 of the low-reflection composite electrode is made of Mo and has a 4.36 nm thickness, the first transparent material layer 12 of the low-reflection composite electrode is made of $SiN_x$ and has a 45.5 nm thickness, and the second metal layer 13 of the low-reflection composite electrode is made of Cu and has a 380 nm thickness.

Figure 4:
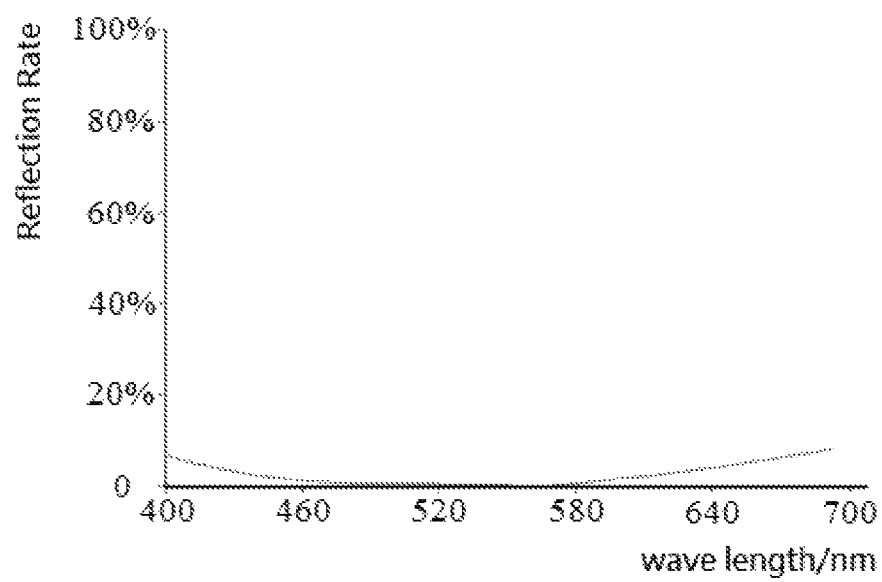
FIG. 4 is a curve diagram showing the reflection rates of a low-reflection composite electrode according to the embodiment 2 of the disclosure.

The reflection rate of the low-reflection composite electrode provided by this embodiment is shown in FIG. 4. As shown in FIG. 4, the average reflection rate of the low-reflection composite electrode provided by this embodiment is less than 3%. Compared with the conventional metal electrode of which the reflection rate is shown in FIG. 3, the low-reflection composite electrode provided by this embodiment has a much smaller reflection rate.

Embodiment 3

The low-reflection composite electrode has a structure shown by FIG. 1. As shown in FIG. 1, the first metal layer 11 of the low-reflection composite electrode is made of Mo and has a 3.63 nm thickness, the first transparent material layer 12 of the low-reflection composite electrode is made of $SiN_x$ and has a 30 nm thickness, and the second metal layer 13 of the low-reflection composite electrode is made of Cu and has a 380 nm thickness.

Figure 5:
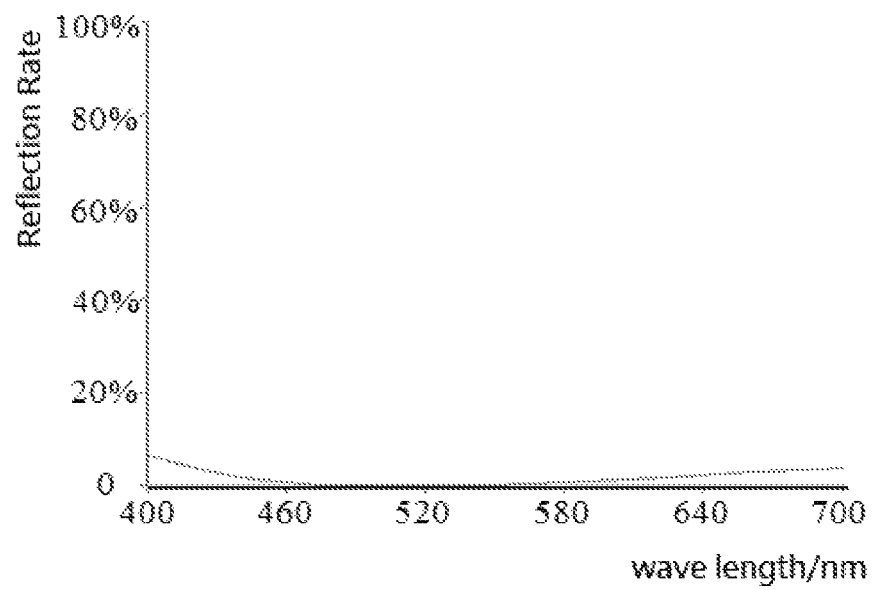
FIG. 5 is a curve diagram showing the reflection rates of a low-reflection composite electrode according to the embodiment 3 of the disclosure.

The reflection rate of the low-reflection composite electrode provided by this embodiment is shown in FIG. 5. As shown in FIG. 5, the average reflection rate of the low-reflection composite electrode provided by this embodiment is less than 3%. Compared with the conventional metal electrode of which the reflection rate is shown in FIG. 3, the low-reflection composite electrode provided by this embodiment has a much smaller reflection rate.

Embodiment 4

The low-reflection composite electrode has a structure shown by FIG. 2. As shown in FIG. 2, the first metal layer 11 of the low-reflection composite electrode is made of ITO and has a 53.8 nm thickness, the first transparent material layer 12 of the low-reflection composite electrode is made of Mo and has a 35.9 nm thickness, and the second metal layer 13 of the low-reflection composite electrode is made of Cu and has a 380 nm thickness.

Figure 6:
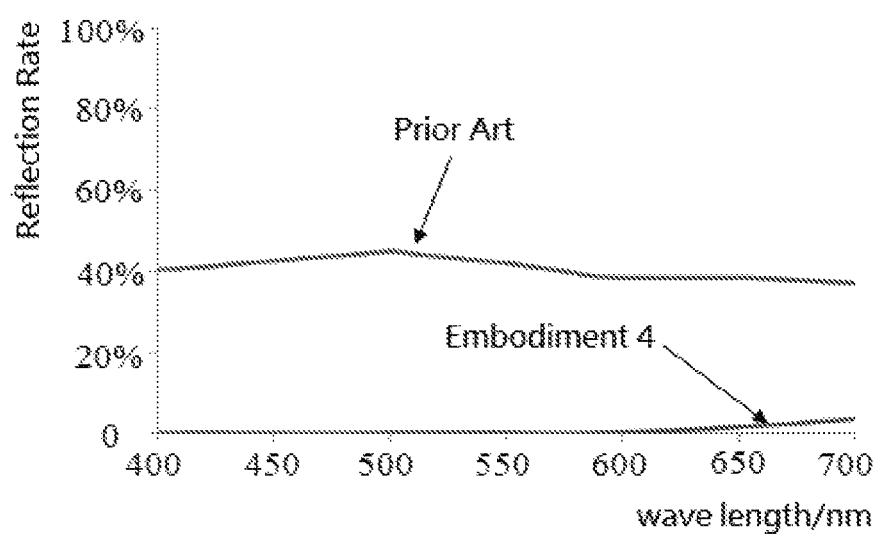
FIG. 6 is a curve diagram showing the reflection rates of a low-reflection composite electrode and a conventional electrode according to the embodiment 4 of the disclosure.

The reflection rate of the low-reflection composite electrode provided by this embodiment is shown in FIG. 6. In FIG. 6, the low reflection rate of the low-reflection composite electrode provided by this embodiment is emphasized by the comparison with the Mo/Cu electrode of the prior art.

As shown in FIG. 6, within a light band of which the wave length range is 400 nm~700 nm, the average reflection rate of a conventional electrode is 40.8%, and within another light band of which the wave length range is 400 nm~650 nm, the average reflection rate of the conventional electrode is 41.4%. However, within a light band of which the wave length range is 400 nm~700 nm, the average reflection rate of the low-reflection composite electrode provided by this embodiment is 0.6%, and within another light band of which the wave length range is 400 nm~650 nm, the low-reflection composite electrode provided by this embodiment is 0.3%. Apparently, the reflection rate of the low-reflection composite electrode provided by this embodiment is so much smaller than the reflection rate of the conventional electrode, which shows that the low-reflection composite electrode provided by this embodiment has an extreme low reflection rate of the within a wide wave length range.

Compared with the conventional electrode made by general materials, the low-reflection composite electrode provided by this embodiment has a much smaller reflection rate. Specifically, the average reflection rate of the low-reflection composite electrode provided by this embodiment can be smaller than 3% within the visible light band and can be smaller than 1% within the green light band.

Embodiment 5

A TFT array substrate is provided by this embodiment. The gate and/or the source/drain of the TFT array substrate are the low-reflection composite electrodes provided by the above embodiments. Details about structures and materials of other elements of the TFT array substrate can be known according to the prior art, and thus they are not described herein.

According to the above descriptions, the TFT array substrate having low-reflection composite electrodes can be perfectly used in AM-OLED and AM-LCD. The gate and/or the source/drain of the TFT array substrate are the low-reflection composite electrodes, so the polarizer in the AM-LED and the low-reflection coating in the AM-LCD become unnecessary. Thus, the production cost can be reduced and the products can have its superiority.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A low-reflection composite electrode, comprising:
a first metal layer;
a first transparent material layer; and
a second metal layer;
wherein the first metal layer, the first transparent material layer and the second metal layer are sequentially stacked, the thickness of the first metal layer is 2 nm~15 nm, the thickness of the second metal layer is 200 nm~500 nm, and the thickness of the first transparent material layer is 10 nm~150 nm.

2. The low-reflection composite electrode according to claim 1, wherein the first metal layer and/or the second metal layer is a single metal layer or a composite metal layer.

3. The low-reflection composite electrode according to claim 2, wherein the first metal layer is made of at least one of Cr, Ti and Mo, the second metal layer is made of at least one of Cu, Al and Mo.

4. The low-reflection composite electrode according to claim 1, further comprising:
a second transparent material layer, stacked on one surface which is of the first metal layer and is opposite to the first transparent material layer.

5. The low-reflection composite electrode according to claim 4, wherein the second transparent material layer is made of a transparent electrode material or a transparent medium material.

6. The low-reflection composite electrode according to claim 4, wherein the thickness of the second transparent material layer is 10 nm-150 nm.

7. The low-reflection composite electrode according to claim 1, wherein the first transparent material layer is made of a transparent electrode material or a transparent medium material.

8. The low-reflection composite electrode according to claim 7, wherein the transparent electrode material is IZO, ITO or IGZO, and the transparent medium material is $SiN_x$, $SiO_x$, $TiO_2$ or $Ta_2O_5$.

9. The low-reflection composite electrode according to claim 7, further comprising:
a second transparent material layer, stacked on one surface which is of the first metal layer and is opposite to the first transparent material layer.

10. The low-reflection composite electrode according to claim 9, wherein the second transparent material layer is made of a transparent electrode material or a transparent medium material.

11. The low-reflection composite electrode according to claim 9, wherein the thickness of the second transparent material layer is 10 nm~150 nm.

12. A TFT array substrate, comprising:
a low-reflection composite electrode, including a first metal layer, a first transparent material layer and a second metal layer;
wherein the first metal layer, the first transparent material layer and the second metal layer are sequentially stacked, the thickness of the first metal layer is 2 nm~15 nm, the thickness of the second metal layer is 200 nm~500 nm, and the thickness of the first transparent material layer is 10 nm~150 nm.

13. The TFT array substrate according to claim 12, wherein the first metal layer and/or the second metal layer is a single metal layer or a composite metal layer.

14. The TFT array substrate according to claim 13, wherein the first metal layer is made of at least one of Cr, Ti and Mo, the second metal layer is made of at least one of Cu, Al and Mo.

15. The TFT array substrate according to claim 12, wherein the first transparent material layer is made of a transparent electrode material or a transparent medium material.

16. The TFT array substrate according to claim 15, wherein the low-reflection composite electrode further includes:
   a second transparent material layer, stacked on one surface which is of the first metal layer and is opposite to the first transparent material layer.

17. The TFT array substrate according to claim 15, wherein the transparent electrode material is IZO, ITO or IGZO, and the transparent medium material is $SiN_x$, $SiO_x$, $TiO_2$ or $Ta_2O_5$.

18. The TFT array substrate according to claim 12, wherein the low-reflection composite electrode further includes:
   a second transparent material layer, stacked on one surface which is of the first metal layer and is opposite to the first transparent material layer.

19. The TFT array substrate according to claim 18, wherein the second transparent material layer is made of a transparent electrode material or a transparent medium material.

* * * * *